United States Patent [19]

Verderber

[11] 4,075,649
[45] Feb. 21, 1978

[54] SINGLE CHIP TEMPERATURE COMPENSATED REFERENCE DIODE AND METHOD FOR MAKING SAME

[75] Inventor: Rudolph R. Verderber, Scottsdale, Ariz.

[73] Assignee: Siemens Corporation, Scottsdale, Ariz.

[21] Appl. No.: 635,241

[22] Filed: Nov. 25, 1975

[51] Int. Cl.² ........................................... H01L 29/90
[52] U.S. Cl. ...................................... 357/13; 357/28; 357/33; 357/40; 357/52; 357/76; 357/89
[58] Field of Search ..................... 357/13, 28, 33, 76, 357/89

[56] References Cited
U.S. PATENT DOCUMENTS

| | | | |
|---|---|---|---|
| 3,567,965 | 3/1971 | Weinerth | 357/13 |
| 3,574,009 | 4/1971 | Chizinsky et al. | 357/20 |
| 3,739,238 | 6/1973 | Hara | 357/13 |

*Primary Examiner*—William D. Larkins
*Assistant Examiner*—Marcus S. Rasco
*Attorney, Agent, or Firm*—Cahill, Sutton & Thomas

[57] ABSTRACT

A reference diode and a method for making same are described, wherein a single wafer of semiconductive material is processed to provide a reverse PN junction acting in its breakdown region and to provide one or more forward PN junctions in electrical series with the reverse junction. A wafer of semiconductive material of one conductivity type is diffused with an impurity to form a plurality of regions of semiconductive material of opposite conductivity type. The regions are laterally displaced from each other and each forms a reverse PN junction at the interface between the region and the remainder of the wafer. An impurity is then diffused into one or more of these regions to form one or more forward PN junctions. An additional reverse PN junction is then formed between and adjacent to two of the previously formed regions. The latter reverse PN junction is formed by alloying or diffusing an impurity into the wafer to provide a region of opposite conductivity type having a higher conductivity than the adjacent regions. The reverse PN junction thus formed by the latter step exhibits a lower breakdown voltage than the adjacent reverse PN junctions. All exposed PN junctions extend to only one surface of the wafer and are passivated. Metal contact pads are then deposited on the opposing faces of the wafer to permit axial connections to the temperature compensated diode.

8 Claims, 13 Drawing Figures

SINGLE CHIP TEMPERATURE COMPENSATED REFERENCE DIODE AND METHOD FOR MAKING SAME

The present invention pertains to reference diodes, and more particularly to temperature compensated reference diodes.

The utilization of reverse PN junctions as voltage reference devices is well known. The operation of PN junction operating beyond the knee of its reverse characteristic provides a relatively stable reference voltage at a predetermined operating current. The reference voltage thus achieved is, however, temperature-dependent and a variation in the reference voltage provided by the junction will be exhibited with a variation in ambient temperature. The temperature coefficient exhibited by a reverse PN junction operating at its breakdown voltage is positive; that is, the reference voltage exhibits a positive change for a positive temperature change. Forward PN junctions operating in the forward characteristic also produce a voltage drop that is temperature-dependent; fortunately, the temperature coefficient of a PN junction operating on its forward characteristic is negative. It is therefore possible to connect one or more forward PN junctions in series with a reverse PN junction to compensate the temperature dependency of the latter and attempt to balance the temperature coefficients.

Temperature compensated reference diodes of the prior art have made use of the opposite temperature coefficients of forward and reverse PN junctions to arrive at relatively small temperature coefficients. The effectiveness of such temperature compensation will depend, of course, to a great extent on the physical arrangement of the junctions so that each junction is subjected to the same temperature. Therefore, proximity of the junctions to each other becomes an important factor. Prior art reference diodes will generally attempt to provide temperature compensation by stacking individual diode chips and relying on the ohmic contact between successive chips to effectively transfer any heat among the diodes to ensure equal temperature among them. The cost of packaging several forward and reverse diode chips to form a temperature compensated package can be expensive; further, the ultimate testing of the diode occurs after the packaging is complete instead of when the individual diode chips have been constructed.

It is therefore an object of the present invention to provide a temperature compensated reference diode having reverse and forward PN junctions formed in a single semiconductor chip.

It is another object of the present invention to provide a temperature compensated reference diode incorporating a reverse PN junction for operating in its breakdown region and one or more forward PN junctions for offsetting the temperature coefficient of the reverse junction.

It is still another object of the present invention to provide a single chip, temperature compensated reference diode having a structure to permit symmetrical axial connection to the anode and cathode of the device regardless of the number of forward PN junctions utilized to compensate a reverse PN junction and wherein all of the junctions are formed in a single semiconductor chip.

It is yet another object of the present invention to provide a single chip, temperature compensated reference diode utilizing a guard ring of reverse PN junctions surrounding a reverse PN junction operating in its breakdown region.

It is also an object of the present invention to provide a method for making a temperature compensated reference diode wherein the reverse breakdown junction is the final high temperature step in the method to permit accurate process control of the reverse junction.

It is still another object of the present invention to provide a method for making a temperature compensated reference diode wherein reverse junctions are formed while a reverse breakdown junction is formed using a higher conductivity semiconductive material to yield a reverse breakdown junction surrounded by a guard ring of reverse PN junctions which do not operate in their breakdown region.

These and other objects of the present invention will become apparent to those skilled in the art as the description proceeds.

Briefly, in accordance with the embodiment chosen for illustration, the present invention contemplates the construction of a temperature compensated reference diode utilizing a single chip of semiconductive material. A wafer of semiconductive material of one conductivity type is provided with a plurality of reverse PN junctions laterally displaced on the wafer from each other. These junctions are formed by known photolithographic masking and etching techniques followed by the diffusion of an appropriate impurity to form regions of semiconductive material of opposite conductivity type. All but one of these regions are masked and a forward PN junction is formed by diffusing an impurity in the unmasked region. The wafer is then again masked and etched to expose an area on the surface of the wafer between two regions of opposite conductivity type. An impurity is then diffused into the exposed area to form a region of semiconductive material of opposite conductivity type between and contiguous with two existing regions of opposite conductivity type but with a higher conductivity than the adjacent regions. A reverse PN junction is thus formed having a lower breakdown voltage than the adjacent PN junctions, the latter having been diffused to form a guard ring surrounding the PN junction operating in breakdown. Metallic contact pads are applied on opposite surfaces of the wafer in contact with semiconductive material of different conductivity types to provide ohmic contacts to the diode.

The present invention may more readily be described by reference to the accompanying drawings in which.

Figure 1:
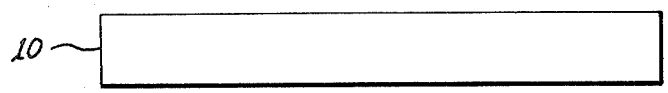
FIGS. 1–7 illustrate the successive steps of the method of the present invention to construct a single chip, temperature compensated reference diode constructed in accordance with the teachings of the present invention having a reverse breakdown PN junction in series with a single forward PN junction.
Figure 2:
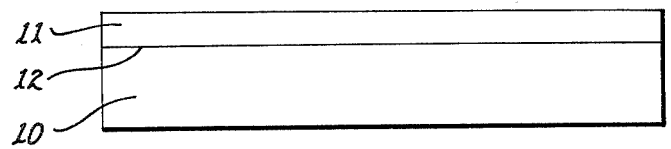
Figure 3:
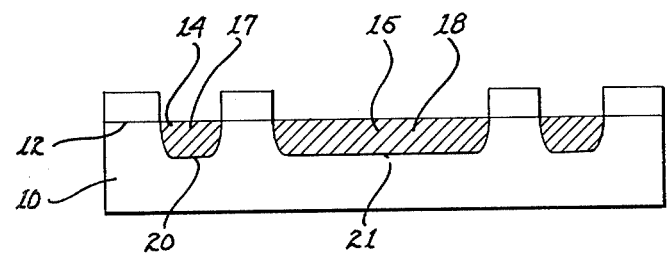
Figure 4:
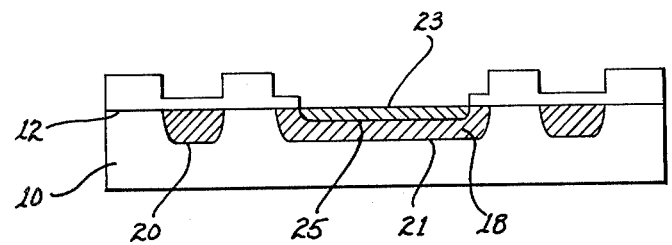
Figure 5:
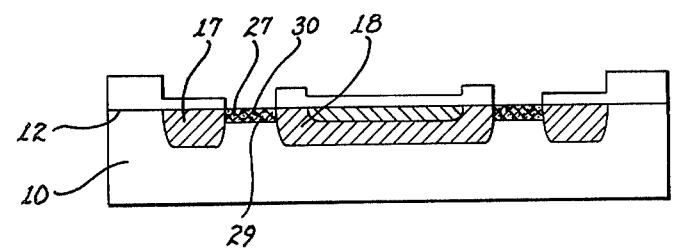

Referring now to FIGS. 1 - 7, the present invention will be described in terms of a wafer of semiconductive material, "n" conductivity type; it will be understood that the selection of conductivity type is merely to facilitate the description of the present invention and that opposite conductivity types may be chosen. A wafer of semiconductive material such as silicon of "n" conductivity type is chosen having an appropriate resistivity. An oxide layer 11 is formed on the surface 12 of the wafer 10 by any well known technique such as thermal growth, deposition, or the like. The oxide layer 11 is photolithographically masked and etched in a manner well known in the art to expose areas 14 and 15 on the surface 12. In the embodiment chosen for illustration, the area 14 surrounds the area 15 for purposes to be described more fully hereinafter. A "p" type impurity is diffused through the surface 12 to form regions 17 and 18 of "p" conductivity. The regions 17 and 18 form reverse PN junctions 20 and 21; the PN junctions 20 and 21 are formed having a breakdown voltage higher than the predetermined reference voltage of the diode.

The exposed surface 12 is again oxide masked to expose a portion 23 thereof over the region 18 and an "n" type impurity is diffused therein to form a forward PN junction 25. Again, an oxide layer is formed, photolithographically masked, and etched to expose a portion 27 of the surface 12 between and contiguous with the regions 17 and 18. A reverse PN junction 29 is then formed by alloying, diffusion or epitaxial growth; the region 30, thus formed adjacent to the regions 17 and 18, is a "p++" region having a higher conductivity than the "p" regions 17 and 18. The reverse PN junction 29 has a breakdown voltage less than the PN junctions 20 and 21. Thus, in operation, only the reverse PN junction 29 will be in breakdown and will be surrounded by reverse PN junctions 20 and 21; further, the regions 17 and 18 form a guard ring surrounding the active breakdown junction. The formation of the junction 29 is the last high temperature step required in the formation of the reference diode of the present invention using well known diffusion, alloying or epitaxial techniques. It is the process control of the reverse breakdown junction 29, which is the most important high temperature step that provides diodes exhibiting characteristics within prescribed operational limits and therefore produces relatively high yields. The process thus far described provides a temperature compensated diode having a single forward PN junction and a reverse breakdown PN junction, the latter surrounded by a guard ring of semiconductive material of the same conductivity type as the type used in the formation of the breakdown junction. All processing has taken place on or through the surface 12 of the wafer 10 and all PN junctions extending to the surface are passivated.

Figure 6:
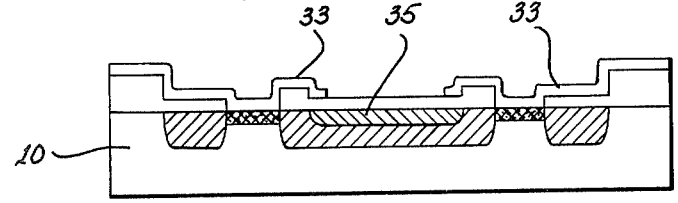
Figure 7:
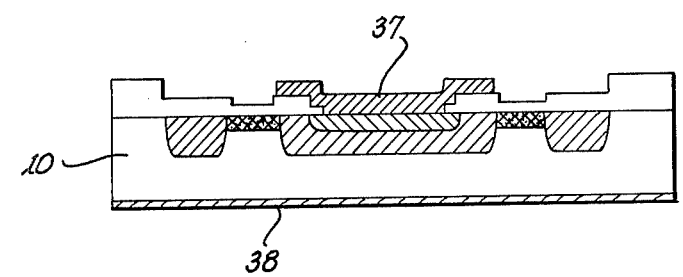
Figure 8:
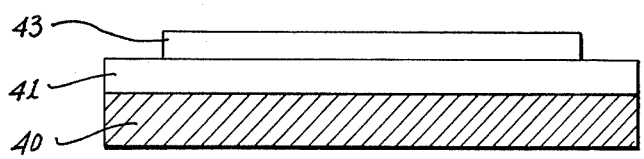
FIGS. 8, 9 and 10 illustrate the successive steps of the method of the present invention when the single chip, temperature compensated reference diode is to incorporate two forward PN junctions and one reverse breakdown PN junction.

An insulating coating 33 is now applied to the top of the wafer as shown in FIG. 6; the coating may be a low temperature oxide or an organic coating to simply act as an insulator to prevent shorting of the exposed "p++" region 30 and "n" region 35. The insulating coating 33 is not a passivating layer and need not therefore be formed using high temperatures which might otherwise be deleterious to the reverse breakdown junction 29.

Metal contact pads 37 and 38 are then formed, such as by deposition, on the exposed "n" region 35 and on the bottom surface of the wafer 10. The metal contact pads 37 and 38 therefore provide a means for connection to external circuitry in the center of the wafer 10 with the contact pads axially aligned, one on top and one on the bottom of the chip.

The formation of the respective PN junctions has been described in terms of diffusion, alloying or epitaxial growth. The formation of the PN junctions may be derived through the utilization of ionic implantation techniques. For example, by the appropriate selection of ionic sources and energy levels, reverse PN junctions 20 and 21 may be formed at a desired depth in the substrate formed of the wafer 10. Subsequently, using a different ionic source and the lower energy level, the forward PN junction 25 may be formed. Reverse breakdown junction 29 is then formed and the conductivity of the region 30 selected, for example, by determining the appropriate dose. A more complete discussion of ionic implantation techniques that may be used in the method of the present invention is described in ION IMPLANTATION IN SEMICONDUCTORS, Mayers, et al. (Academic Press, 1970).

Figure 9:
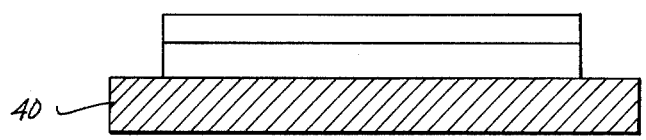
Figure 10:
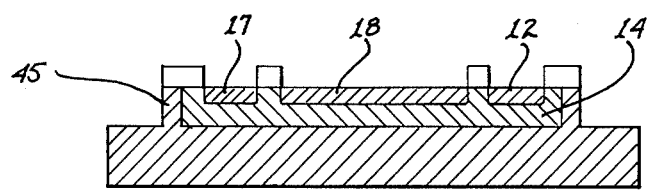
Figure 11:
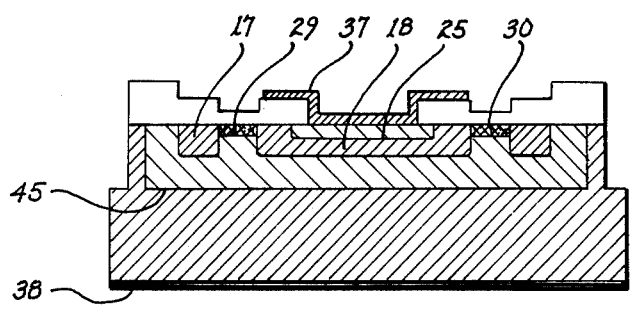
FIG. 11 is a cross-section of a single chip temperature compensated reference diode constructed in accordance with the teachings of the present invention employing three PN junctions.

The process of the present invention may be used to produce temperature compensated diodes having more than a single temperature compensated forward PN junction in the wafer. Referring to FIGS. 8 - 11, a wafer 40 of suitable resistivity and conductivity type (for example, "p" type) is chosen. A layer 41 of "n" type semiconductive material is formed such as by epitaxial growth; the layer 41 may alternatively be formed by a long diffusion step. An oxide layer 43 is deposited or grown, is photolithographically masked and is etched along with the layer 41 through to the layer 40 forming a structure as shown in FIG. 9. The steps as described in connection with FIGS. 1 - 7 are then repeated; it may be noted that the first diffusion of a "p" type impurity to form regions 17 and 18 also laterally diffuses to form "p" region 45 which effectively encases "n" regions 41 in "p" type semiconductive material with the exception of the masked portions of the surface 12. This lateral diffusion brings the lower exposed junction under the passivating oxide layer on top. The completion of the steps described above in connection with FIGS. 1 - 7 results in the structure of FIG. 11. Referring to FIG. 11, it may be seen that the reverse breakdown PN junction 29 is formed by "p++" region 30 and is surrounded by the "p" regions 17 and 18 forming guard rings about the reverse breakdown junction. A forward PN junction 25 and a second forward PN junction 45 are in electrical series with the reverse breakdown junction 29. Metal contact pads 37 and 38 permit axial connection to the device and all PN junctions are passivated. Again, the final high temperature step is that step which forms the reverse breakdown junction 29.

Figure 12:
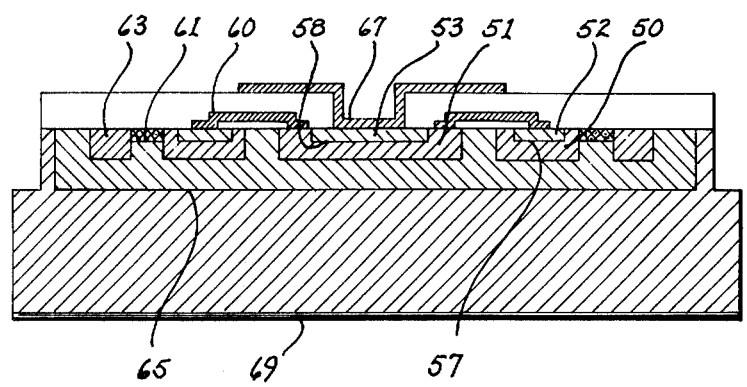
FIG. 12 is a single chip, temperature compensated reference diode constructed in accordance with the teachings of the present invention employing four PN junctions.
Figure 13:
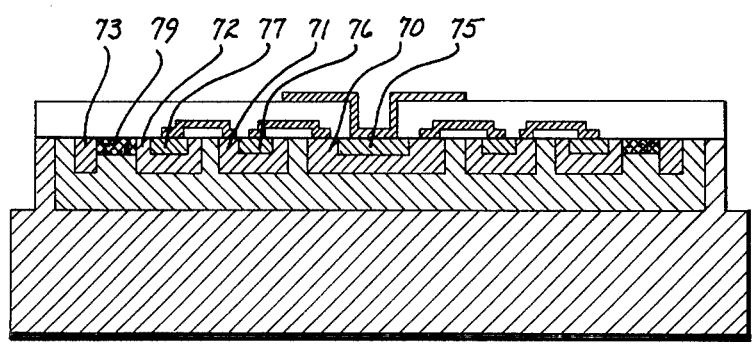
FIG. 13 is a single chip, temperature compensated reference diode constructed in accordance with the teachings of the present invention employing five PN junctions.

Referring to FIGS. 12 and 13, four and five PN junction devices are shown constructed in accordance with the teachings of the present invention. In FIG. 12, for example, forward PN junctions are provided by diffusion of "p" material to form "p" regions 50, 51 and 63 followed by the diffusion to form "n" regions 52 and 53, respectively. Forward PN junction 57 is then electrically connected in series with forward PN junction 58 by forming metallized layer 60 to interconnect "p" region 51 with "n" region 52. The metallizing step to form layer 60 may be a simple deposition of conductive metal using well known techniques. A reverse breakdown PN junction 61 is provided with the guard ring of the "p" region 63. A third forward PN junction 65 completes the device to provide three forward PN junctions and one reverse breakdown junction; all PN junctions that are exposed are exposed at a single surface and are passivated. The device is provided with an overlay 62 of low temperature glass over the layer or pad 60 and between the pad 67 and the layer 60. Metallized contact pads 67 and 69 permit axial connection to the device.

A temperature compensated reference diode having any number of junctions may be produced in accordance with this method without increasing the number of steps. For example, FIG. 13 is an illustration of a five-junction temperature compensated diode. It may be seen therein that "p" regions 70, 71, 72 and 73 are formed simultaneously in a single diffusion step; similarly, "n" regions 75, 76 and 77 are formed in a single diffusion step. The formation of a higher conductivity region 79 is the final high temperature step in the process so that the formation of the reverse breakdown PN junction may be carefully controlled without the subsequent deleterious effects of other high temperature steps.

The process of the present invention produces a unique temperature compensated diode exhibiting several significant and important features. The number of process steps to produce the device is less than that required by prior art processes, and the device can be tested and evaluated before the additional step of packaging. Since the device is formed on a single semiconductor chip, packaging of the device is less expensive than that required by the multi-chip devices of the prior art. The contact pads of the devices are centrally located on the top and bottom of the chip; further, the reverse breakdown junction is formed by the final high temperature step in the process to thereby produce an increased yield of devices.

The process and temperature compensated diode of the present invention present substantial flexibility which cannot be found in the prior art. For example, by controlling junction area, junction separation and selection of lifetimes, a theoretical ideal zero temperature coefficient can more closely be approached than in the prior art; further, dependence of the temperature coefficient with variations in operating current can be minimized.

The geometry of the device of the present invention is readily altered without changing the process so that reverse and forward junctions can be made sufficiently electrically identical to provide a temperature compensated reference diode that will operate without regard to polarity.

I claim:

1. A single chip temperature compensated reference diode comprising:
   a. a wafer of semiconductive material of one conductivity type;
   b. a first layer of semiconductive material of an opposite conductivity type diffused through a surface of said wafer to form a first reverse PN junction;
   c. a second layer of semiconductive material of an opposite conductivity type diffused through said surface of said wafer to form a second reverse PN junction extending substantially the same depth as said first reverse PN junction and laterally displaced from said first reverse PN junction;
   d. a third layer of semiconductive material of an opposite conductivity type formed in said wafer, laterally contiguous to said first and second layers, to form a third reverse PN junction, said third layer having a higher conductivity than said first and second layers, the reverse PN junctions formed by said first and second layers of semiconductive material laterally surrounding said third reverse PN junction to form a guard ring thereabout;
   e. the reverse PN junctions formed by said first, second and third layers forming a continuous reverse PN junction with portions thereof having a lower breakdown voltage than the remainder of the reverse junction; and
   f. a fourth layer of semiconductive material of said one conductivity type diffused into said first layer to form a forward PN junction.

2. The single chip temperature compensated reference diode of claim 1 wherein the reverse PN junctions formed by said first and second layers of semiconductive material extend to a greater depth, measured from said surface, into said wafer than the reverse PN junction formed by said third layer of semiconductive material and form a guard ring laterally surrounding said third reverse PN junction.

3. The single chip temperature compensated reference diode of claim 2 wherein all of said PN junctions terminate at said surface of said wafer and wherein a passivating layer is disposed on said surface over the PN junctions terminating at said surface.

4. The single chip temperature compensated reference diode of claim 3 including a pair of metallic layers, one contacting said fourth layer of semiconductive material and the other contacting a surface of said wafer opposite said fourth layer to form metal contact pads.

5. A single chip temperature compensated reference diode comprising:
   a. a wafer of semiconductive material of one conductivity type;
   b. a first plurality of discrete regions of semi-conductive material of opposite conductivity type diffused through one surface of said wafer to form a plurality of reverse PN junctions;
   c. a second plurality of discrete regions of semiconductive material of said one conductivity type each diffused into a different one of said first plurality of regions to form a plurality of forward PN junctions;
   d. means electrically connecting each of said forward PN junctions in series;
   e. a breakdown region of semiconductive material of opposite conductivity type formed in said wafer laterally adjacent to two of said first plurality of discrete regions, said breakdown region having a higher conductivity than said first plurality of regions to form a reverse breakdown PN junction having a lower breakdown voltage than the other reverse PN junctions; said two of said first plurality of discrete regions laterally surrounding said breakdown region to form a guard ring thereabout; and
   f. said means electrically connecting said forward PN junctions in series comprises electrically connnecting each of the discrete regions of said second plurality of regions to a different one of said discrete regions of said first plurality of regions.

6. The single chip temperature compensated reference diode of claim 5 wherein said adjacent two of said first plurality of discrete regions extends to a greater depth, from said one surface, than said reverse breakdown PN junction to form a lateral guard ring around said reverse breakdown PN junction.

7. The single chip temperature compensated reference diode of claim 5 wherein said plurality of reverse PN junctions and plurality of forward PN junctions extend to the surface of said wafer and wherein a passivating layer is disposed on said surface over the PN junctions terminating at such surface.

8. The single chip temperature compensated reference diode of claim 7, including a metallic layer disposed on one of the discrete regions of said second plurality of discrete regions and a second metallic layer disposed on an opposite surface of said wafer opposed to said first metallic layer to form metal contact pads.

* * * * *